(12) United States Patent
Uchino et al.

(10) Patent No.: US 8,370,783 B2
(45) Date of Patent: Feb. 5, 2013

(54) SYSTEMS AND METHODS FOR PROBABILISTIC INTERCONNECT PLANNING

(75) Inventors: Taku Uchino, Kanagawa (JP); Alvan Ng, Austin, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 943 days.

(21) Appl. No.: 11/949,583

(22) Filed: Dec. 3, 2007

(65) Prior Publication Data

US 2009/0144688 A1    Jun. 4, 2009

(51) Int. Cl.
*G06F 17/50* (2006.01)

(52) U.S. Cl. ........ 716/131; 716/113; 716/114; 716/126; 716/129; 716/130

(58) Field of Classification Search .............. 716/12–14, 716/108–115, 126, 128, 129, 130, 131
See application file for complete search history.

(56) References Cited

U.S. PATENT DOCUMENTS

| | | | |
|---|---|---|---|
| 7,013,445 B1* | 3/2006 | Teig et al. ............ | 716/9 |
| 7,076,406 B1* | 7/2006 | Tetelbaum ............ | 703/2 |
| 2001/0047507 A1* | 11/2001 | Pileggi et al. ......... | 716/8 |
| 2004/0268277 A1* | 12/2004 | Francom et al. ....... | 716/5 |
| 2006/0156266 A1* | 7/2006 | Alpert et al. ......... | 716/13 |

FOREIGN PATENT DOCUMENTS

| | | |
|---|---|---|
| JP | 10-091673 | 4/1998 |
| JP | 11-126825 | 5/1999 |

OTHER PUBLICATIONS

Wong et al., "Fast Buffer Planning and Congestion Optimization in Interconnect-driven Floorplanning", IEEE Asia South Pacific Design Automation Conference, pp. 411-416, 2003.
R.Kaya, Office Action, Japanese patent application 2008-307735, Nov. 2, 2010.

\* cited by examiner

*Primary Examiner* — Nha Nguyen
(74) *Attorney, Agent, or Firm* — Law Offices of Mark L. Berrier

(57) ABSTRACT

Systems and methods for interconnect planning which utilize probabilistic methodologies. One embodiment comprises a method for planning interconnect models in an integrated circuit design. Nets and a set of interconnect models that can be used to connect the pins of each net are first defined. For each net, the probability that each interconnect model will be used to connect the pins of the net is evaluated. Tiles in the integrated circuit design are then assigned probabilities indicating the likelihood that each of the interconnect models will traverse the tiles. A map is then generated to indicate probabilistic routing characteristics (e.g., probabilities of wire congestion, interconnect component congestion, power densities, interconnect model usage) based on the probabilities assigned to each of the tiles in the integrated circuit design. The map may then be output (e.g., printed or otherwise displayed) to a user or stored for later use.

15 Claims, 5 Drawing Sheets

SYSTEMS AND METHODS FOR PROBABILISTIC INTERCONNECT PLANNING

BACKGROUND

1. Field of the Invention

The invention relates generally to the design of integrated circuits and, more particularly, to systems and methods to aid in the design of component interconnections accommodating various design criteria using a probabilistic approach.

2. Related Art

As digital devices (e.g., integrated circuits) have become more complex, including more and more electronic components, better tools are needed to design these devices. In particular, design tools need to be made more efficient just to handle the ever increasing size of the design problems.

One of the biggest concerns in current and future VLSI technology is that interconnect delay is not scaling at the same rate as the device delay. Interconnect delay is becoming more and more dominant. This has led to the consideration of interconnect planning during earlier stages of integrated circuit design than was previously necessary. The interconnect planning includes routing layer assignment, wire width assignment, wire spacing assignment, and repeater planning for each net (i.e., for each interconnection between pins.) These assignments consider timing, area congestion, wire congestion, and power consumption.

While some existing electronic design automation (EDA) tools may be able to provide this kind of functionality, their congestion analysis is usually based on global routing and it poses at least the following two problems: (a) long run time—global routers usually require a great deal of time to find a routing pattern for each net; and (b) tool dependency—the specific routing patterns created by a particular global router are not always reproduced by a different router, that is, interconnect planning based on global routing does not generally predict results which are independent of the routing tool that is used.

It would therefore be desirable to provide systems and methods for planning interconnect routing that reduce the amount of run time required to at least estimate the routing for each net in the design, as well as providing results which are independent of the specific routing tool that is used.

SUMMARY OF THE INVENTION

One or more of the difficulties of the prior art can be reduced or eliminated by using probabilistic interconnect planning. Probabilistic interconnect planning methodologies shorten run time, since each net is probabilistically analyzed, and they consider combinations of all possible routing patterns rather than a specific one, so they are tool-independent.

Broadly speaking, the invention includes systems and methods incorporating probabilistic methodologies to aid in the design of component interconnections accommodating various design criteria.

One embodiment comprises a method for probabilistic planning of interconnect models in an integrated circuit design. Pairs of pins to be connected (i.e., "nets") in the design are defined, as are a set of interconnect models that can be used to connect the pins of each net. For each net, the probability that each interconnect model will be used to connect the pins of the net is evaluated. Tiles in the integrated circuit design are then assigned probabilities indicating the likelihood that each of the interconnect models will traverse the tiles. A map is then generated to indicate probabilistic routing characteristics (e.g., probabilities of wire congestion, interconnect component congestion, power densities, interconnect model usage) based on the probabilities assigned to each of the tiles in the integrated circuit design. The map may then be output (e.g., printed or otherwise displayed) to a user or stored for later use.

In one embodiment, the method makes use of floorplan data for the integrated circuit design, including positions for the pins and for circuit components in the design. It is preferred that the method is performed first for a net that has the most critical timing constraints between the pins of the net, and then for a net with less critical timing constraints (i.e., in order of decreasing time-criticality.) In one embodiment, the method considers tiles within an initial boundary which includes a subset of the tiles in the design. If none of the interconnect models evaluated for the tiles within the initial boundary satisfy the timing constraints associated with the net being considered, the boundary is expanded and the interconnect models are evaluated for tiles within the expanded boundary.

Another embodiment comprises a software product. The software product comprises a computer-readable medium which contains program instructions that cause the computer to perform the method described above.

Numerous additional embodiments are also possible.

The various embodiments of the invention may provide a number of advantages over prior art systems and methods, such as decreased run time, tool-independent maps of probabilistic routing characteristics apparent to those of skill in the art of the invention.

BRIEF DESCRIPTION OF THE DRAWINGS

Other objects and advantages of the invention may become apparent upon reading the following detailed description and upon reference to the accompanying drawings.

Figure 1:
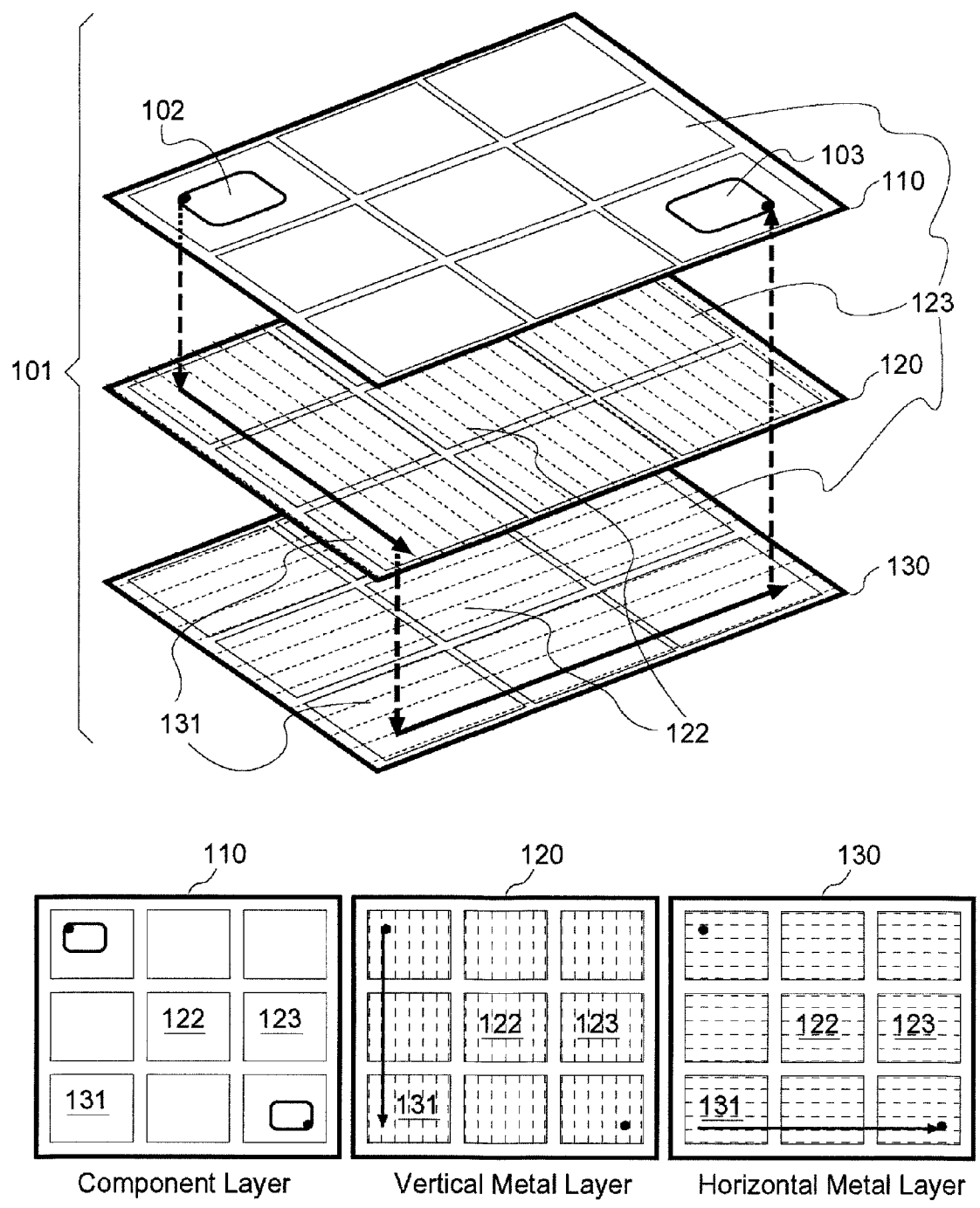
FIG. 1 is a functional block diagram illustrating a tiling of an IC's layers in accordance with one embodiment.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for probabilistic interconnect planning to aid in the design of component interconnections in integrated circuits.

An important part of the design process is the determination of the interconnections between the various components laid out on the integrated circuit (IC). During the design process, in one embodiment, an iteration through the nets comprising an IC is performed to progressively refine the circuit design. A preliminary design including a floorplan (i.e., component layout/placement) and timing requirements is provided. For each net of the design, probabilities are calculated for the possible/allowable interconnection models. These are examined to determine which is most likely to be used. The result of applying such a model for the net is incorporated into a map of the design and the iteration continues. The map can show probabilities of such characteristics as wire congestion, interconnect component congestion, power density or interconnect model usage. In another embodiment, several or even all the calculated probabilities are combined and incorporated into the design map.

In one embodiment, the IC design is partitioned into regions (referred to herein as tiles). Some subset is used to plan the interconnections for a given net. The interconnections can be described by various models. An interconnect model in this embodiment is a combination of routing layers, repeater cell type, wire width and wire spacing. As each net interconnection is defined (in other words, an interconnect model is assigned to the net) and resources are used, the resources are further constrained. Amongst these resources are the wiring tracks/traces on the metal layers. Thus, for example, as traces in a particular tile are used, less are available for use by subsequently assigned interconnect models.

Referring to FIG. 1, a diagram illustrating a portion of an IC is shown. The upper portion of the figure shows an exploded view of the layers of the IC. The lower portion of the figure shows an upper view of each of the separate layers in order to more clearly depict the positions of the IC components and the orientation of the traces. It should be noted that, in actuality, the layers are stacked together, and vias through the layers connect the wire traces and components.

In this embodiment, IC 101 has three layers (110, 120, 130) as illustrated in the embodiment used in FIG. 1. Layer 110 contains components 102 and 103 of a net. Metal layers 120 and 130 are dedicated to the "vertical" and "horizontal" wires (traces), respectively, used for interconnections.

As wires are laid out on the layers, the layers become more congested. Consider that the IC is described as being logically partitioned into (nine) tiles such as tile 123. Note that wires on both the vertical and horizontal layers pass through tile 131. As tiles become more congested, interconnections can be directed into the less congested tiles. If, for example, tile 131 were completely congested (a.k.a., blocked) then the interconnection will have to be routed through alternative tiles, such as tile 122. The choice of tiles for a particular set of components is restricted for efficiency but may be altered/increased to accommodate requirements. Done appropriately, the layers can be used efficiently.

Figure 2:
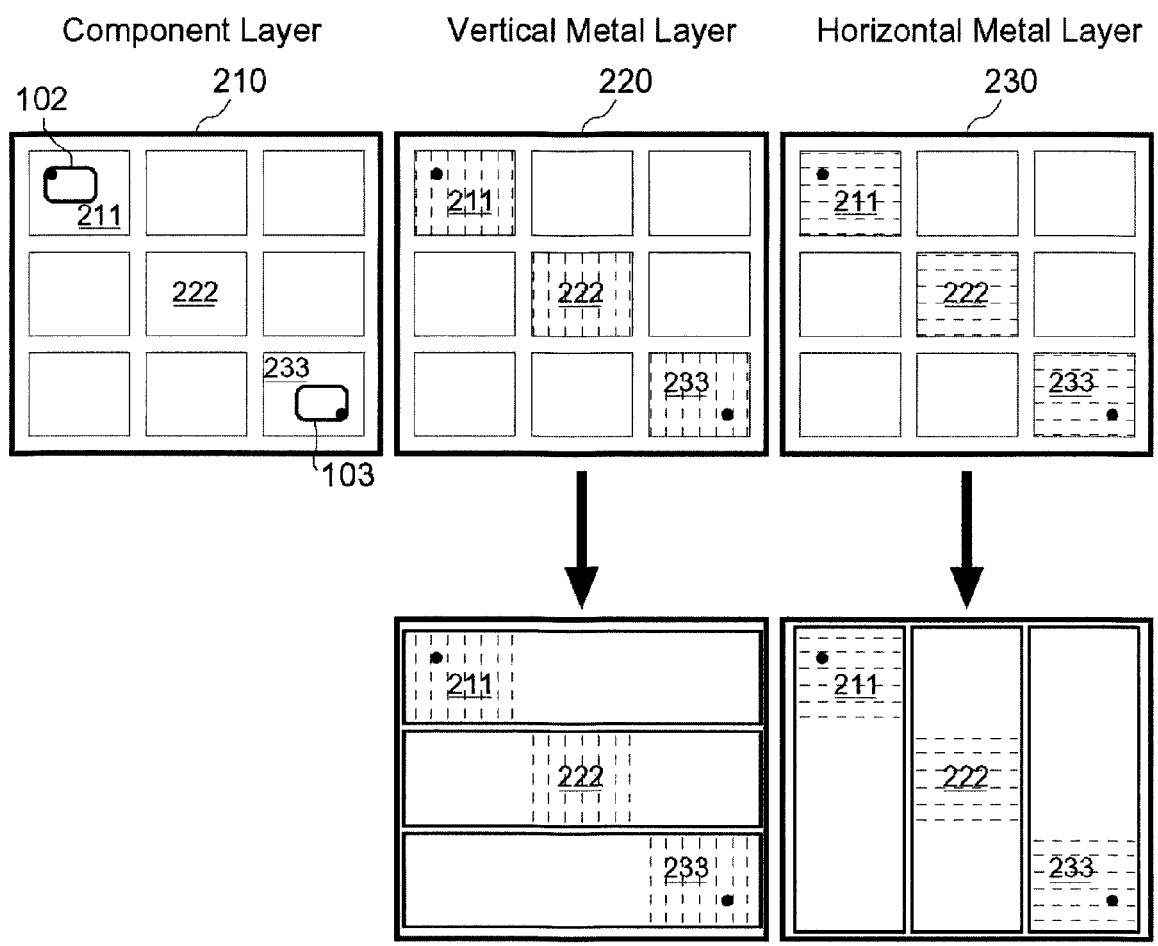
FIG. 2 is a functional block diagram illustrating a grouping of tile resources in accordance with one embodiment.

In another example, illustrated in FIG. 2, the tiles' resources are grouped. Similar to the layout of FIG. 1, there is a net connecting components 102 and 103. Traces on metal layers 120 and 130 are available for routing the "vertical" and "horizontal" wires, respectively, used for interconnections. However, in the alternative embodiment used in the example of FIG. 2, tile resources are considered in groups. For example, the tiles of "vertical" and "horizontal" layers 220 and 230 are grouped into rows and columns, respectively, and the availability of wiring paths considered for each group. The available paths are illustrated as dashed lines. As illustrated, it may be that the only tiles with available wiring paths are the non-neighboring tiles 211, 222, and 233 (where neighbors share a side). That is, a discontinuous routing might be implied when examining this isolated instance. In practice, such a "loosening" of a resource constraint allows for quicker solutions and typically results in a final design with well-defined interconnections being laid out by a router. The tradeoff of an increase in speed for the occasional routing problem is generally considered to be worthwhile.

Embodiments may use differing input data. The input data may include timing data, power data, and physical data (regarding the floorplan, components and layers). An embodiment may include a predetermined set of library of interconnection models.

The intermediate data as well as output of the various embodiments can include area congestion, wire congestion, power density, metal layer selection, number of layers, etc.

Figure 3:
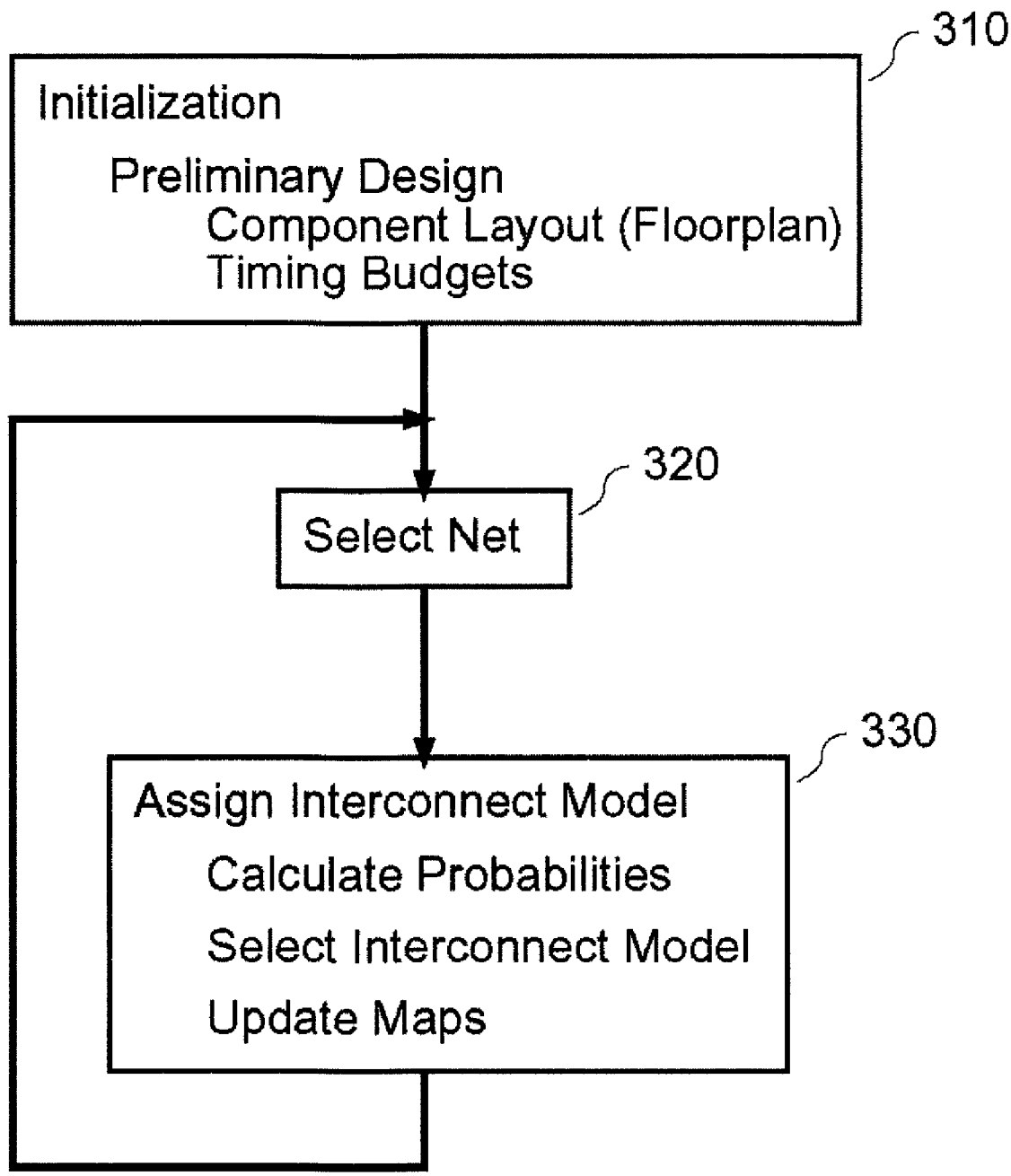
FIG. 3 is a flowchart illustrating probabilistic interconnect planning in accordance with one embodiment.

A flowchart of one embodiment is illustrated in FIG. 3. Following an initialization (310) a net is selected (320) and processed (330) including the assignment of probabilities to each interconnect model and subsequent updating of design data.

First, a preliminary design and other initialization data are provided. This includes timing constraint information in the form of timing budgets. An iteration is then performed processing each of the nets in turn.

The nets are processed in timing critical order. For each net, a set of interconnect models is selected. Any interconnect model in this set can be realized. The set of interconnect models are selected so that they satisfy not only the requirements imposed by the component placement but also any constraints such as timing budgets. An interconnect model is more likely realized than another if it results in an implementation/design with less congestion.

This method does not create a specific routing. Instead of picking up one specific interconnect model, this method assigns a probability to each possible interconnect model. The probability is calculated based on the power, area, and wire congestion of the region where the interconnect model will be realized. The probability represents a measure of how close a model is to being ideal.

Once the probabilities are calculated, the contribution from each possible interconnect model is added to the power, area, and wire congestion database according to its probability. In other words, the resulting power, area, and wire congestion data are a superposition/combination of possible routing patterns using various routing layers and repeaters. In this sense, this method takes into account all possible interconnect models The assignment of each interconnect model to power, area, and wire congestion database is also probabilistic. For example, instead of finding a specific routing pattern, this method distributes the wire into the routing area according to local wire congestion, in such a way that wires are distributed to less congested areas. After processing all nets, the output is passed on to the next step in the design process.

This method is useful for a large design early in the design process to determine not only the feasibility of floorplan (component placement) considering timing constraints as well as power, wire, and repeater congestion, but also the feasibility of the metal stack definition.

Figure 4:
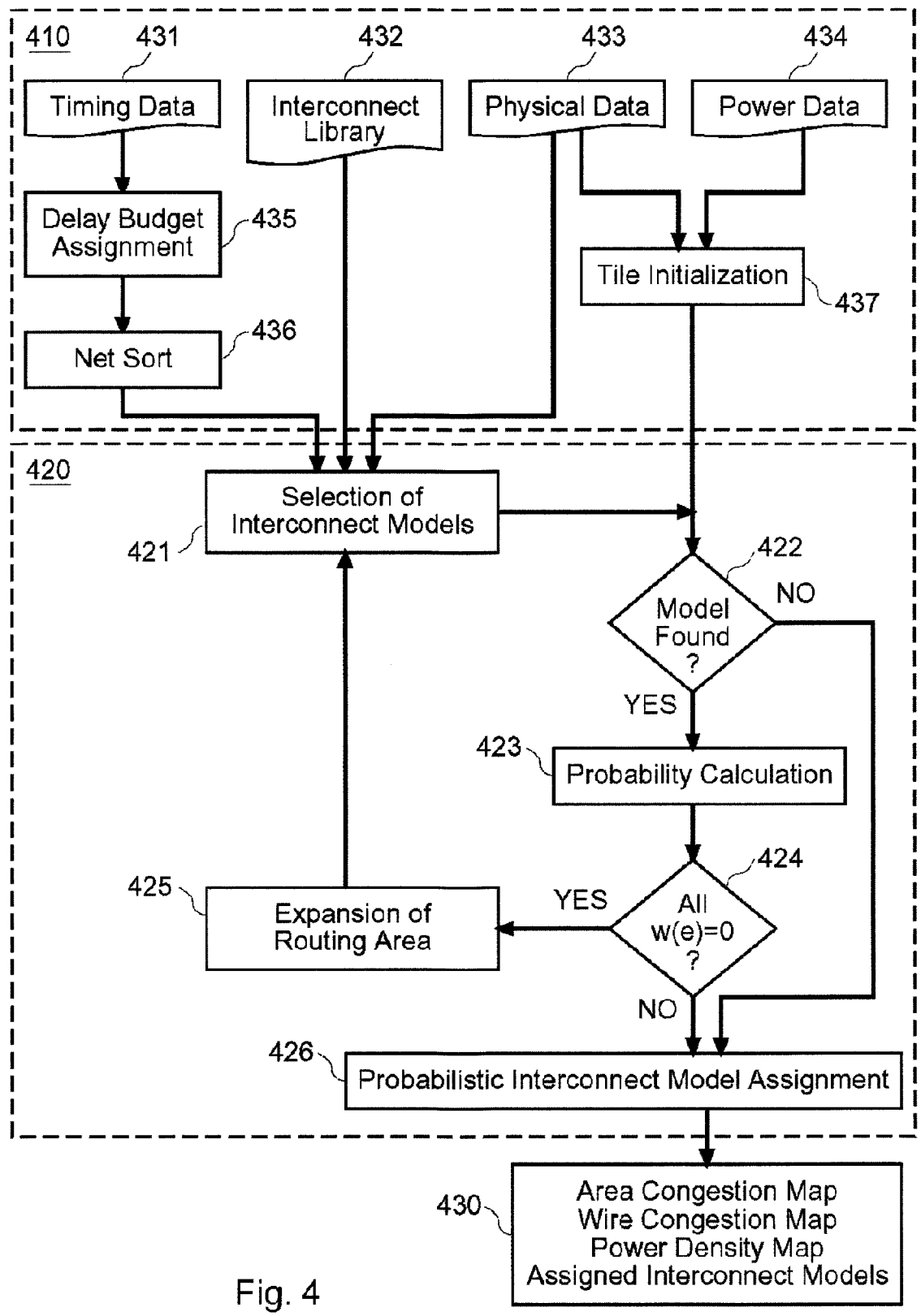
FIG. 4 is a flowchart illustrating probabilistic interconnect planning in accordance with one embodiment.

FIG. 4 shows a detailed flow chart in accordance with one embodiment. In the following, the inputs (410), processes/iteration (420), and outputs (430) are explained. The input data includes timing data (431) such as intrinsic cell delays and required arrival times, physical data (433) such as cell placement and blockages, power data (434), and a library of interconnect models (432). The initialization also includes the processes and/or results of tile initialization (e.g., tiling 437), delay budget assignment (435), and net sorting (436). Tile Initialization 437 not only divides the unit into tiles but also initializes the data associated with them. Delay budget assignment 435 translates the path-based timing constraints into net-based timing constraints. Net sort 436 determines the processing order of the nets based on timing criticality.

The iteration through the nets (420) includes the selection of interconnect models (421), and probability calculations (423). The interconnect models are selected to satisfy timing constraints and a probability is determined for each model. If the probabilities are zero, the set of tiles used is expanded (425). The nonzero probabilities (interconnect models) are then assigned to the associated tiles (426). This collection of data can be used to produce area congestion, wire congestion, and power density maps (430).

The elements of the flowchart of FIG. 4 are described in more detail in the following paragraphs.

Input Data

Timing Data (431). The timing data includes timing constraints such as arrival time and required arrival time at each pin. It also includes cell intrinsic delay from input pin or internal latch point to output pin or other internal latch point. The connectivity information can be also included into timing data, where connectivity information includes the connection between nets and pins. A pin driving a net is called source and a pin driven by a net is called sink in the following. A net can have multiple sources and sinks.

Those timing data can be obtained, for example, from a comprehensive timing report of EinsTimer™.

Physical Data (433). The physical data includes cell placement, pin location, and blockages on each routing layer. Blockages include cell internal shapes and pre-wires such as clock, power buses, and engineered wires. In general, repeaters are not included as part of a non-engineered net since repeater planning is one of the purposes of this method.

Those physical data can be obtained, for example, from the internal data structure of ChipBench™ using its user interface functions.

Power Data (434). The power data includes static power consumption, dynamic power consumption per switching, and switching frequency at each source pin.

Power data can be obtained from the results of a power analysis.

Interconnect Library (432). The interconnect library is a set of interconnect models. An interconnect model is a combination of (M, W, S, C) where M=(H,V) is a pair of routing layers (horizontal and vertical, H and V, respectively), W is the wire width, S is the wire spacing, and C is the repeater cell type. This embodiment assumes the similar electric properties and design rules for both the horizontal and vertical layers of an interconnect model. Here, the resistance and capacitance per unit length is the same for the minimum feature wires on both horizontal and vertical layers. Note that two different interconnect models can have different pairs of horizontal and vertical layers. The electric properties can be also different for different layer pairs.

The following function F is associated with interconnect library:

$$F:(M,W,S,C,L) \rightarrow (N,D),$$

where L is the wire length, N is the number of the repeaters to be inserted, and D is the interconnect delay including both wire and repeater delay. F can be defined so that N is the number of repeaters which minimizes D. Alternatively, F can be defined so that N is the minimum number of repeaters to satisfy slew constraints. The function, or look-up table, F can be obtained by performing a SPICE simulation for each interconnect model using the technology parameters such as wire resistance and capacitance per unit length on each layer, and SPICE models of repeaters, for example.

In the following, "e" often denotes an interconnect model (M, W, S, C).

Processes

Tile Initialization (437). The Tile Initialization process divides the unit into tiles and initializes the data associated with them. The following data are associated with each tile T:

TX, TY: width and height of tile T
A(T,0): available placement area in tile T
A(T,i): available routing tracks in tile T on layer i (i=1, . . . , n), where n is the number of metal layers
B(T): power consumption in tile T For example, A(T,0) is the area of the tile T, that is TX times TY, minus the area of the intersection between tile T and already placed cells. Similarly, A(T,i) is the available routing tracks on layer i within tile T after excluding blockages described in "Physical Data 433". B(T) includes the power consumption of already placed cells. More specifically, the contribution to B(T) from each cell is proportional to the area of the intersection between tile T and the cell. In "Probabilistic Interconnect Model Assignment 426" process, A(T,i) (i=0, . . . , n) and B(T) will be updated as each interconnect model is assigned to each tile.

Delay Budget Assignment (435). The Delay Budget Assignment process assigns a required interconnect delay to each source-sink pair of the net by translating the path-based timing constraints into net-based timing constraints. In other words, this process distributes the timing slack on each timing path to its nets by adjusting required interconnect delay for each source-sink pair. The required interconnect delay is determined so that timing slack on each timing path becomes non-negative. If the original timing slack is positive, the required interconnect delay can be relaxed from the current interconnect delay. If the original timing slack is negative, the required interconnect delay can be stricter than the current interconnect delay. The required interconnect delay is called "delay budget" in the following. The details of an algorithm for delay budget assignment are omitted from this disclosure, but may be found in the disclosure of U.S. patent application Ser. No. 11/733,091, entitled "Delay Budget Allocation with Path Trimming".

Net Sort (436). The Net Sort process determines the order of the nets to be processed based on timing criticality. Timing criticality of a net is defined, for example, as the maximum value of "current interconnect delay" minus "delay budget" over all source-sink pairs of the net, where "delay budget" was calculated by the previous process "Delay Budget Assignment 435". Typically, in the routing phase of a design, the timing critical nets are routed before non-timing critical ones. In this sense, such an embodiment is timing-driven.

In the following processes surrounded by dashed box 420 in FIG. 4, each net is processed in timing critical order defined by the Net Sort process.

Selection of Interconnect Models (421). The Selection of Interconnect Models process finds a set of interconnect models, which satisfy timing constraints for all the source-sink pairs of the net. Let G denote this set of interconnect models. A necessary and sufficient condition that an interconnect model e=(M,W,S,C) is an element of G is that D(p,e) is equal to or less than the delay budget for each source-sink pair p of the net, where D(p,e) is the interconnect delay of the source-sink pair p when an interconnect model e is used. D(p,e) is calculated using the function F defined in "Interconnect Library 432" as (N,D(p,e))=F(M,W,S,C,L(p)), where L(p) is the Manhattan distance between the source and sink of p. L(p)

can be calculated using "Physical Data 433". The purpose of this process is to guarantee the timing. By focusing on the interconnect models belonging to G, the timing constraints are automatically satisfied. In the following processes, only the elements of G are dealt with.

If G is empty ("NO" branch of 422 in FIG. 4), there is no interconnect model which satisfies timing constraints. However, a certain interconnect model has to be assigned to the net in any case to update power, area, and wire congestion database. For this purpose, if G is empty, redefine G to be the one-element set of the fastest interconnect model, whose interconnect delay per unit length is the smallest. Although the delay budget is not satisfied, this interconnect model is the closest solution. After modifying G in this way, the program jumps to "Probabilistic Interconnect Model Assignment 426" just to update tile data such as power, area and wire congestion. Also, the user is notified that the timing constraints were not satisfied.

Probability Calculation (423). The Probability Calculation process assigns a probability to each interconnect model in set G, where G is the set of interconnect models defined by "Selection of Interconnect Models 421" for the net being processed. The probability represents the degree of possibility that the interconnect model would be selected by a router and a user as an ideal solution. Since this method does not assume any specific router, the probability should be determined without knowledge of any routers. In this embodiment, the probability is defined so that an interconnect model with higher probability gives less area congestion, less wire congestion, and/or less power consumption than the one with lower probability.

Let P(e) denote the probability of interconnect model e. P(e) is defined as follows:

$$P(e) = \frac{w(e)}{\sum_{g \in G} w(g)},$$

$$w(e) = w_A(e) \times w_W(e) \times w_P(e),$$

where w(e) is the "weight" of interconnect model e, and wA(e), wW(e), and wP(e) represent the weights for area, wire, and power, respectively. wA(e) is defined such that an interconnect model e with larger wA(e) gives less area congestion. Similarly, wW(e) is defined such that an interconnect model e with larger wW(e) results in/from less wire congestion. Also, wP(e) is defined such that an interconnect model e with larger wP(e) consumes less power. Note that there are tradeoff relationships among wA(e), wW(e), and wP(e). For example, an interconnect model with larger wire width and spacing needs fewer repeaters than the one with smaller wire width and spacing because of the smaller resistance of the wide metal and smaller coupling capacitance of the wide spacing. This means an interconnect model with larger wire width and spacing needs less repeater area (larger wA(e)) while it requires more routing tracks (smaller wW(e)). Similarly, wP(e) depends on wire width and spacing. When the wire is wide, the power due to charging and discharging of the wire is large while the power consumed by repeaters is small since the number of repeaters is small. On the other hand, when the wire is narrow, the power due to charging and discharging of the wire is small while the power consumed by repeaters is large since the number of the repeaters is large in this case. To arbitrate these tradeoff relationships, wA(e), wW(e), and wP(e) are multiplied to each other to define w(e).

The above definition of w(e) is not the only way to define the weight w(e). It could have been defined such that the weight is as follows:

$$w(e) = (w_A(e))^\alpha \times (w_W(e))^\beta \times (w_P(e))^\gamma,$$

where exponents α, β, and γ are parameters to be adjusted by a user. If the user wants to focus on reducing wire congestion, the user selects larger β and smaller α and γ.

For example, assume (α, β, γ)=(1, 2, 1). Given the two (wA(e), wW(e), wP(e)) triples of (0.9,1,1) and (1,0.9,1), the first would be chosen because the corresponding weights w(e) would be 0.9 and 0.81, respectively.

In the following, examples of wA(e), wM(e), and wP(e) are shown.

Weight for Area: wA(e)

$$w_A(e) = \min_p \left( \sum_{T \in U(p)} A(T, 0) - N(p) \times K(C) \right),$$

where U(p) is the set of the tiles covering the bounding box of the pins of source-sink pair p of the net being considered, N(p) is the number of repeaters obtained by (N(p),D)=F(M,W,S,C,L(p)), K(C) is the area of a repeater of cell type C, and $$"\min_p"$$

represents the minimum value among all the source-sink pairs p of the net. wA(e) represents the smallest resulting available area of all U(p) for a given e. wA(e) is defined such that less area congestion yields a larger wA(e). If wA(e) is less than 0, then this means there is no room to place repeaters. In this case, set wA(e)=0 to make w(e)=0. In other words, such interconnect model can not be used.

Figure 5:
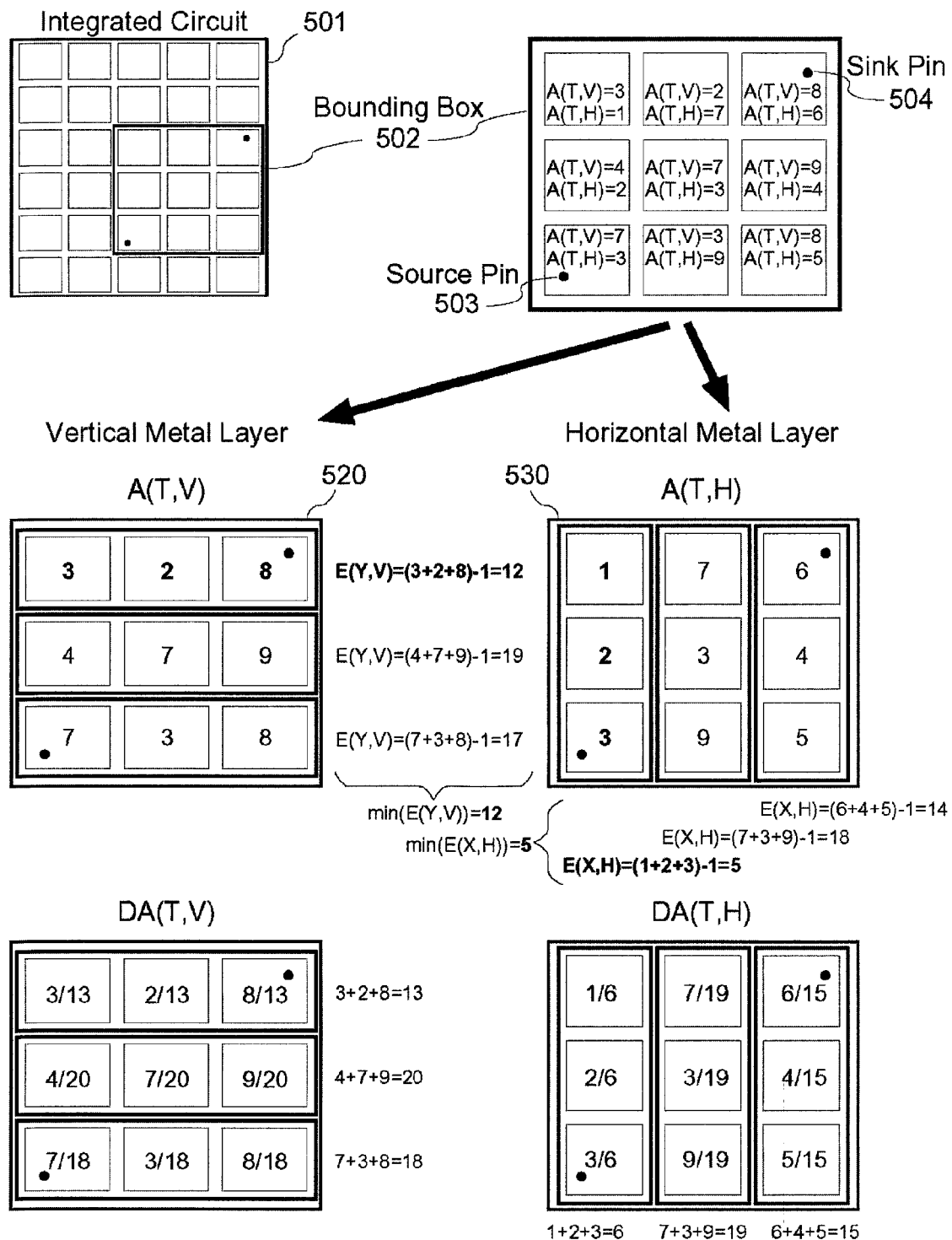
FIG. 5 is a functional block diagram illustrating tile resources of an IC's metal layers in accordance with one embodiment.

Weight for Wire: wW(e) (See FIG. 5, which illustrates bounding box 502 of IC 501, source-sink pair (503,504), vertical metal layer 520, horizontal metal layer 530.)

$$w_W(e) = \min_p \left( \min \left( \min_{X \in Col(U(p))} E(X, H), \min_{Y \in Row(U(p))} E(Y, V) \right) \right),$$

$$E(X, H) = \sum_{T \in X} A(T, H) - R(W, S, H),$$

$$E(Y, V) = \sum_{T \in Y} A(T, V) - R(W, S, V),$$

where U(p) is the set of the tiles covering the bounding box of the pins of source-sink pair p, Col(U(p)) is the set of the columns of U(p), Row(U(p)) is the set of the rows of U(p), H and V are the horizontal and vertical metal layers of interconnect model e=(M,W,S,C), and R(W,S,i) is the routing tracks occupied by wire of width W and spacing S on layer i, where i is either H or V. Usually, R(W,S,i)=(W+S)/(Wmin+Smin), where Wmin and Smin are minimum wire width and spacing on layer i, respectively. A column of U(p) is a set of tiles in U(p) in which adjacent tiles share upper or lower edges. A row of U(p) is a set of tiles in U(p) in which adjacent tiles share left or right edges. When X is a column of U(p), E(X,H) represents the resulting available horizontal routing tracks in X after the wire with interconnect model e is routed to connect source pin and sink pin of p. Hence, $$\min_{X \in Col(U(p))} E(X, H)$$

respresents the minimum available horizontal routing tracks among all columns in U(p). In other words, it represents the horizontal routability of the wire with interconnect model e. Similarly, $$\min_{Y \in Row(U(p))} E(Y, V)$$

represents vertical routability of the wire with interconnect model e. As a result, wW(e) represents the routability of the net with interconnect model e.

FIG. 5 illustrates E(X,H) and E(Y,V). wW(e) is defined such that less wire congestion yields larger wW(e). If wW(e) is less than 0, there are no available routing tracks. In this case, set wW(e)=0 to make w(e)=0. In other words, such an interconnect model can not be used.

Weight for Power: wP(e)

$$w_P(e) = \frac{1}{Pwr(e)},$$

where Pwr(e) is the power consumption of the net when it is realized with interconnect model e. Pwr(e) is expressed as follows:

$$Pwr(e) = \sum_{p} (N(p) \times P_C(e) + L(p) \times P_W(e)),$$

where the summation is over all the source-sink pairs p, N(p) is the number of repeaters obtained by (N(p),D)=F(M,W,S,C,L(p)), PC(e) is the static and dynamic power consumed by one repeater of interconnect model e, and PW(e) is the power due to charging and discharging of a unit length wire of interconnect model e. Since dynamic power depends on the switching frequency of the net, PC(e) and PW(e) depend on the switching frequency of the net although it is not explicitly written in the above equation. wP(e) is defined such that less power consumption yields larger wP(e).

Expansion of Routing Area (425). If w(e)=0 for all the interconnect models e in G, the probability P(e) can not be determined. This means there is no available repeater area or routing tracks within area U(p) for some of the source-sink pairs p, for example. In such a case, U(p) is expanded to include one more outer rows and columns of tiles to search for available area or routing tracks. Correspondingly, the wire length L(p) becomes longer, for example, by 2×TX+2×TY on average since additional TX and TY are necessary to route the wire to the added outer rows and columns and another TX and TY are necessary to go around the corner in the added outer tiles. This means detoured routing is allowed in this case. The set G must be also updated since L(p) is changed. With new G and U(p), w(e) is recalculated. If all the w(e) are still 0, then U(p) is again expanded. This continues until a nonzero value of w(e) is found or U(p) covers the whole design. The loop usually stops before U(p) covers the whole design since G becomes empty as L(p) becomes large. In other words, the number of the interconnect models to satisfy the timing constraints decreases as the wire becomes long. When G is empty, G is forced to be the one-element set of the fastest interconnect model as described in "Selection of Interconnect Models 421" and the flow jumps to "Probabilistic Interconnect Model Assignment 426" through "NO" branch of 422 in FIG. 4. To summarize, when expanding the routing area, the flow after "Net Sort 436" becomes as follows, as shown in FIG. 4:

1. Construct set G as described in "Selection of Interconnect Models 421".
2. If G is empty, redefine G to be the one-element set of the fastest interconnect model and go to "Probabilistic Interconnect Model Assignment 426" ("NO" branch of 422 in FIG. 4).
3. Calculate w(e) as described in "Probability Calculation 423".
4. Check whether w(e)=0 for all the interconnect models e in G or not (424 in FIG. 4). If NO, then go to "Probabilistic Interconnect Model Assignment 426". If YES, then go to next step.
5. Expand U(p) by adding rows and columns on top, bottom, left and right of U(p) and by adding 4 corner tiles for those source-sink pairs p whose placement area or routing tracks were used up within U(p). Also, increment wire length L(p) by 2×TX+2×TY. These procedures correspond to "Expansion of Routing Area 425" in FIG. 4. After this step, go back to "Selection of Interconnect Models 421".

Probabilistic Interconnect Model Assignment (426). The Probabilistic Interconnect Model Assignment process assigns each interconnect model in G to each tile T by updating A(T,i) (i=0, . . . , n) and B(T) based on the probability P(e) as follows:

---

Foreach source - sink pair p,
  Foreach e ∈ G,
    Foreach T ∈ U (p),
      A(T,0) ⇐ A(T,0) − P(e) × DA(T,0)
      A(T, H) ⇐ A(T, H) − P(e) × DA(T, H)
      A(T,V) ⇐ A(T,V) − P(e) × DA(T,V)
      B(T) ⇐ B(T) + P(e) × DB(T)
    end Foreach
  end Foreach
end Foreach

---

DA(T,0) is the area within tile T occupied by the repeaters for p when interconnect model e is used. Similarly, DA(T,H) and DA(T,V) are horizontal and vertical routing tracks within tile T occupied by the wires for p, respectively, and DB(T) is the power within tile T consumed by the repeaters and wires for p. These contributions from each interconnect model are added to or subtracted from A(T,0), A(T,H), A(T,V), and B(T) multiplied by the probability of the interconnect model. This means the resulting area, wire, and power data are superpositions of interconnect models weighted by probabilities P(e). In this way this method can consider more than one interconnect model at a time and yield general power, area, and wire congestion data.

Remember that each net is being processed in timing critical order. The freedom to use a particular interconnect model is high when the timing critical nets are being processed since the area and routing availability is still high at this stage. As the area and routing tracks are occupied, this freedom is decreased but the freedom of choosing interconnect models is increased since the nets being processed at this stage would be less timing critical (relatively), and allow for a wider variety of interconnect models thus avoiding congested tiles/layers.

In other words, the timing critical nets have little choice of interconnect models but can be routed since there are a lot of available area and routing tracks at the beginning of the whole process. On the other hand, when processing non-timing critical nets, there may be no available routing tracks on the layers with which timing or power would be optimized but those nets can be routed using different layers since they have more choices of interconnect models. In this way, timing and routability are both likely guaranteed. This follows the situation when the routing is performed later in the design process.

In the following, examples of DA(T,0), DA(T,H), DA(T,V), and DB(T) are shown:

DA(T,0)

$$DA(T, 0) = N(p) \times K(C) \times \frac{A(T, 0)}{\sum_{t \in U(p)} A(t, 0)}$$

The area of the repeaters N(p)×K(C) is distributed to each tile T with the probability proportional to the available placement area in T, A(T,0). This arises from the assumption that a repeater will be likely placed in a tile whose area congestion is small.

DA(T,H) and DA(T,V) (See FIG. 5.)

$$DA(T, H) = R(W, S, H) \times \frac{A(T, H)}{\sum_{t \in Col(U(p),T)} A(t, H)}$$

$$DA(T, V) = R(W, S, V) \times \frac{A(T, V)}{\sum_{t \in Row(U(p),T)} A(t, V)}$$

where H and V are the horizontal and vertical routing layers of interconnect model e, Col(U(p),T) is the column of U(p) which includes tile T, and Row(U(p),T) is the row of U(p) which includes tile T. The routing tracks R(W,S,H) of a piece of the horizontal wire going through a column Col(U(p)) is distributed to each tile T in the column with the probability proportional to A(T,H), the available horizontal routing tracks in T.

Similarly, the vertical routing tracks R(W,S,V) is distributed to each tile in a row Row(U(p)) with the probability proportional to A(T,V). That is to say, the wires going through each row or column will be likely routed in a tile whose wire congestion is small. FIG. 5 illustrates DA(T,H) and DA(T,V). Note that the probability is independently assigned to each tile regardless of the routing pattern. In other words, this embodiment does not take into account the routing pattern represented by a continuous set of tiles, where "continuous set of tiles" is a set of tiles whose covering area can not be topologically divided into more than one connected component. In other words, if the wire reaches to a tile, then the next wire segment should occupy the adjacent tile. To ensure this, the routing pattern would need to be recognized. A global router could be used but takes relatively long run time to find a feasible routing pattern as previously mentioned. As a high-level estimation and planning tool, such accuracy is not required and saving run time is more important. Therefore, this embodiment employs a simple way to assign wires to tiles (as described above). However, alternate embodiments could consider routing patterns by introducing correlations among probabilities assigned to tiles.

DB(T)

$$DB(T) = N(p) \times P_C(e) \times \frac{A(T, 0)}{\sum_{t \in U(p)} A(t, 0)} +$$

$$T_X \times P_W(e) \times \frac{A(T, H)}{\sum_{t \in Col(U(p),T)} A(t, H)} + T_Y \times P_W(e) \times \frac{A(T, V)}{\sum_{t \in Row(U(p),T)} A(t, V)}$$

where PC(e) is the static and dynamic power consumed by one repeater of interconnect model e, and PW(e) is the power due to charging and discharging of a unit length wire of interconnect model e. The expression of DB(T) indicates that the cell power N(p)×Pc(e) is distributed according to the area availability, and wire power L(p)×PW(e) is distributed according to the routing track availability. This is in accordance with the definition of DA(T,0), DA(T,H) and DA(T,V).

Output Data (430). The output data of this embodiment includes an area congestion map, wire congestion map, power density map, and the assigned interconnect models for the nets. The maps may, for example, be presented as colored graphic data on GUI. The color can be assigned to each tile T based on the value of A(T,i) (i=0, . . . , n), or B(T). A list of interconnect models and their probabilities for each net can be also generated. If there is no interconnect model which satisfies the timing constraints, a warning of such should be generated. A list of nets going through each tile can also be generated.

The output data can be used to evaluate the feasibility of a floorplan and timing. The feasibility of metal layer stack definition can be also evaluated. Based on the interconnect models assigned by this method, buffering, timing analysis, and routing can be performed. For this purpose, only one interconnect model need be chosen for each net. The interconnect model with the largest probability P(e) may be selected, for example. Another approach is to randomly select an interconnect model according to probability P(e). With this latter approach, for example, assume that set G has two interconnect models e1 and e2, and P(e1)=0.4 and P(e2)=0.6. A random number between 0 and 1 is generated. If it is less than 0.4, then e1 is selected; otherwise, e2 is selected.

It should be noted that, while the foregoing discussion focuses on method embodiments of the invention, an alternative embodiment comprises a software program product. This product consists of a computer-readable storage medium that contains program instructions configured to cause a computer to perform a method as described above. The computer-readable storage medium may include any of a number of storage media, such as RAM, ROM, flash memory, EPROM memory, EEPROM memory, registers, hard disks, removable disks, CD-ROMs, optical media and so on. The instructions contained in the storage medium may be executable by any type of data processor, and are not limited to instructions executable by personal or general purpose computers.

While the foregoing description presents several specific exemplary embodiments, there may be many variations of the described features and components in alternative embodiments. For example, in other embodiments, different routing characteristics may be included in the output map, or the results of the analyses may be output in a form other than a map. For instance, the output may be stored as raw data (e.g., wire congestion as a function of location. In other embodiments, other variations may be possible, such as the consideration of more complex nets than simple pin-to-pin connections. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs,) field programmable gate arrays (FPGAs) or other logic devices, discrete gates or transistor logic, discrete hardware components, or any combination thereof designed to perform the functions described herein.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an IC.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A computer-implemented method comprising:
storing data defining nets and corresponding pins for connection in an integrated circuit design;
storing data defining a plurality of interconnect models;
dividing the integrated circuit into a plurality of tiles;
for each net,
a computer selecting from among the plurality of interconnect models one or more interconnect models that satisfy timing constraints of the net for a set of tiles of the plurality of tiles,
the computer assigning probability to each selected interconnect model of the net, the probability being a degree of possibility that the interconnect model will be used to connect the pins of the net and being evaluated based on at least one of area congestion, wire congestion, and power consumption when the interconnection model is used to connect the pins of the net;
the computer assigning contribution from each selected interconnect model to area congestion, wire congestion, and power consumption of each tile of the plurality of tiles;
the computer generating a map of the integrated circuit design indicative of probabilistic routing characteristics based on the contribution assigned to each of the tiles in the integrated circuit design and the probability of each selected interconnect model; and
wherein each of the interconnect model is a combination of routing layers, repeater cell type, and wire width and spacing.

2. The method of claim 1, wherein the method is performed for multiple nets, in order of decreasing time-criticality.

3. The method of claim 1, wherein, for each net: the selected interconnect models are evaluated for the set of tiles within an initial boundary; and when none of the selected interconnect models satisfy area or routing constraints, the selected interconnect models are evaluated for a set of tiles within an expanded boundary.

4. The method of claim 1, wherein the method comprises indicating probabilities of wire congestion on the map.

5. The method of claim 1, wherein the method comprises indicating probabilities of interconnect component congestion on the map.

6. The method of claim 1, wherein the method comprises indicating probabilities of power densities on the map.

7. The method of claim 1, wherein the method comprises indicating probabilities of interconnect model usage on the map.

8. A non-transitory computer-readable medium comprising instructions that cause a computer to:
store data defining nets and corresponding pins for connection in an integrated circuit design;
store data defining a plurality of interconnect models;
divide the integrated circuit into a plurality of tiles;
for each net, select from among the plurality of interconnect models one or more interconnect models that satisfy timing constraints of the pins of the net for a set of tiles of the plurality of tiles, assign probability to each selected interconnect model of the net, the probability being a degree of possibility that the interconnect model will be used to connect the pins of the net and being evaluated based on at least one of area congestion, wire congestion, and power consumption when the interconnection model is used to connect the pins of the net, and assign contribution from each selected interconnect model to area congestion, wire congestion, and power consumption of each tile of the plurality of tiles;

generate a map of the integrated circuit design indicative of probabilistic routing characteristics based on the contribution assigned to each of the tiles in the integrated circuit design and the probability of each selected interconnect model; and wherein each of the interconnect model is a combination of routing layers, repeater cell type, and wire width and spacing.

9. The computer-readable medium of claim 8, wherein the instructions further cause the computer to store data defining a floorplan for the integrated circuit design including positions for the pins and for one or more circuit components in the integrated circuit design.

10. The computer-readable medium of claim 8, wherein the instructions further cause the computer to perform operations in claim 10 for multiple nets in order of decreasing time-criticality.

11. The computer-readable medium of claim 8, wherein, for each net: the selected interconnect models are evaluated for the set of tiles within an initial boundary; and when none of the selected interconnect models satisfy area or routing constraints, the selected interconnect models are evaluated for a set of tiles within an expanded boundary.

12. The computer-readable medium of claim 8, wherein the instructions further cause the computer to indicate probabilities of wire congestion on the map.

13. The computer-readable medium of claim 8, wherein the instructions further cause the computer to indicate probabilities of interconnect component congestion on the map.

14. The computer-readable medium of claim 8, wherein the instructions further cause the computer to indicate probabilities of power densities on the map.

15. The computer-readable medium of claim 8, wherein the instructions further cause the computer to indicate probabilities of interconnect model usage on the map.

* * * * *